(12) United States Patent
Kawamura

(10) Patent No.: US 11,047,923 B2
(45) Date of Patent: Jun. 29, 2021

(54) GROUND FAULT DETECTION DEVICE

(71) Applicant: Yazaki Corporation, Tokyo (JP)

(72) Inventor: Yoshihiro Kawamura, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 16/806,018

(22) Filed: Mar. 2, 2020

(65) Prior Publication Data

US 2020/0319261 A1 Oct. 8, 2020

(30) Foreign Application Priority Data

Apr. 3, 2019 (JP) .............................. JP2019-071042

(51) Int. Cl.
*G01R 31/52* (2020.01)
(52) U.S. Cl.
CPC .................................... *G01R 31/52* (2020.01)
(58) Field of Classification Search
CPC ..... G01R 31/52; G01R 31/64; G01R 31/3835
See application file for complete search history.

(56) References Cited

U.S. PATENT DOCUMENTS

| 2015/0285851 A1* | 10/2015 | Kawamura | B60L 3/0069 324/509 |
|---|---|---|---|
| 2018/0224493 A1 | 8/2018 | Kawamura | |
| 2019/0128943 A1* | 5/2019 | Kawamura | G01R 31/52 |

FOREIGN PATENT DOCUMENTS

JP 2018-128320 A 8/2018

\* cited by examiner

*Primary Examiner* — Clayton E. LaBalle
*Assistant Examiner* — Michael A Harrison
(74) *Attorney, Agent, or Firm* — Sughrue Mion, PLLC

(57) ABSTRACT

A ground fault detection device that is connected to an ungrounded battery, estimates an insulation resistance of the system provided with the battery, and detects a ground fault, includes a capacitor that operates as a flying capacitor, two C-contact switches that switch a V0 charging path including the battery and the capacitor, a Vcn charging path including the battery, a negative-side insulation resistance that is an insulation resistance between a negative side of the battery and ground, and the capacitor, a Vcp charging path including the battery, a positive-side insulation resistance insulation resistance that is an insulation resistance between a positive-side insulation resistance of the battery and ground, and the capacitor, and a measurement path that serves both a charge voltage measurement and a discharge of the first capacitor, and an optical MOS-FET capable of blocking charge inflow to and charge outflow from the capacitor.

9 Claims, 11 Drawing Sheets

GROUND FAULT DETECTION DEVICE

BACKGROUND OF THE INVENTION

Field of the Invention

The present invention relates to a ground fault detection device using a flying capacitor.

Description of the Related Art

In a hybrid car equipped with an engine and an electric motor as drive sources, and electric cars, a battery mounted on a vehicle body is charged and driving force is generated using an electric energy supplied from the battery. Generally, battery-related power circuit is configured as a high voltage circuit that handles high voltages of 200V or more, and the high voltage circuit has an ungrounded configuration that is electrically insulated from the vehicle body serving as a ground reference potential point for ensuring safety.

In a vehicle equipped with an ungrounded high voltage battery, a ground fault detection device is provided for monitoring an insulation state (ground fault) between a system with a high voltage battery, specifically a main power system from the high voltage battery to the motor and the vehicle body. A method using a capacitor that is so-called a flying capacitor is widely used for the ground fault detection device.

FIG. 8 is a diagram showing a circuit example of a conventional ground fault detection device of a flying capacitor method. As shown in the figure, the ground fault detection device 400 is connected to an ungrounded high voltage battery 300 and detects a ground fault of a system provided with a high voltage battery 300. Here, an insulation resistance between a positive electrode side of the high voltage battery 300 and the ground shall be represented by RLp, and an insulation resistance between a negative electrode side and the ground by RLn.

As shown in this figure, the ground fault detection device 400 with a detection capacitor C1 operating as a flying capacitor. In addition, in order to switch a measurement path and control charging and discharging of the detection capacitor C1, four switching elements S1 to S4 formed of an optical MOS-FET around the detection capacitor C1.

In the ground fault detection device 400, in order to grasp the insulation resistances RLp and RLn, measurement period of V0 measurement period→Vcn measurement period→V0 measurement period→Vcp measurement period is reiterated as one cycle. In any measurement periods, after charging the detection capacitor C1 with the voltage to be measured, the charging voltage of the detection capacitor C1 is measured. Then, the detection capacitor C1 is discharged for the next measurement.

In the V0 measurement period, a voltage corresponding to the high voltage battery 300 voltage is measured. For this reason, the switching elements S1 and S2 are turned on, the switching elements S3 and S4 are turned off, and the detection capacitor C1 is charged. That is, as shown in FIG. 9A, the high voltage battery 300, a resistance R1, and the detection capacitor C1 serve as the measurement path.

When measuring a charging voltage of the detection capacitor C1, as shown in FIG. 9B, the switching elements S1 and S2 are turned off, the switching elements S3 and S4 are turned on and the control device 420 performs sampling. Then, the detection capacitor C1 is discharged through the same path. When measuring the charging voltage of the detection capacitor C1, an operation when the detection capacitor C1 is discharged is similar to another measurement period.

In the Vcn measurement period, a voltage reflecting an influence of the insulation resistance RLn is measured. For this reason, the switching elements S1 and S4 are turned on, the switching elements S2 and S3 are turned off, and the detection capacitor C1 is charged. That is, as shown in FIG. 10A, the high voltage battery 300, the resistance R1, the detection capacitor C1, a resistance R4, ground, and an insulation resistance RLn serve as the measurement path.

In the Vcp measurement period, a voltage reflecting the influence of the insulation resistance RLp is measured. For this reason, the switching elements S2 and S3 are turned on, the switching elements S1 and S4 are turned off, and the capacitor C1 is charged. That is, as shown in FIG. 10B, the high voltage battery 300, the insulation resistance RLp, ground, the resistance R3, the resistance R1, and the detection capacitor C1 serve as the measurement path.

It has been known that (RLp×RLn)/(RLp+RLn) can be obtained based on (Vcp+Vcn)/V0 calculated from V0, Vcn, Vcp obtained during these measurement periods. For this reason, the control device 420 in the ground fault detection device 400 can grasp the insulation resistances RLp and RLn by measuring V0, Vcn, and Vcp. When the insulation resistances RLp and RLn become below a predetermined reference level, a ground fault occurs, then outputting an alarm.

By the way, as shown in FIGS. 9A, 9B and FIGS. 10A, 10B, the switching element S1 and switching element S3 of a positive electrode side power line 301 system are not simultaneously turned on, and the switching element S2 and switching element S4 of a negative electrode side power line 302 system are not simultaneously turned on. That is, the switching element S and the switching element S3 are switched exclusively, and switching element S2 and switching element S4 are switched exclusively.

Focusing on this point, Patent Literature 1, as shown in FIG. 11, discloses a ground fault detection device 500 in which a positive-side insulation resistance C-contact switch 511 is used as a switching element of the positive electrode side power line 301, and a negative-side C-contact switch 512 is used as a switching element of the negative electrode side power line 302. The C-contact switch is, for example, constituted by a high-voltage small signal mechanical relay or reed relay, reducing an increase in cost of the ground fault detection device 100 because of less expensiveness than the optical MOS-FET.

CITATION LIST

Patent Literature

Patent Literature 1: JP-A-2018-128320

SUMMARY OF THE INVENTION

The ground fault detection device 400 having four optical MOS-FETs shown in FIG. 8 can form a state in which the detection capacitor C1 is disconnected from both the battery 300 and the ground by switching off all switches.

On the other hand, contact c, which is a common contact in the C-contact switch, is connected to either a contact a or a contact b, and there is no neutral off-state. For this reason, in the ground fault detection device 500 using the C-contact switch shown in FIG. 11, each pole of the detection capacitor C1 is either connected to battery 300 (charge side) or connected to ground side (measurement side). Thus, it is not possible to temporarily stop charging while holding the charge. The C-contact switch is cheaper than the optical MOS-FET, but the reaction speed is on the other hand slower.

For this reason, the ground fault detection device 500 using the C-contact switch temporarily is not suitable for the process of stopping charging and restarting charging after measuring. This is because the discharge amount of the charge charged in the battery increases when resuming charging.

Charging resumption after temporary suspension of charging is not used in the basic measurement described above, but may be used in a functionally expanded manner, for example, in the case that during the measurement period of Vcn and Vcp, intermediate measurement and measurement extension are performed.

Here, the intermediate measurement is a processing measuring the charging voltage of the detection capacitor C1 during the original charging time. When the measurement value of the intermediate measurement exceeds the reference value due to a decrease in insulation resistance, etc., canceling subsequent charging can avoid unnecessary high voltage application, and can early determine the ground fault. On the other hand, if the intermediate measurement value does not exceed the reference value, charging is resumed and continued until the original charging time is reached, and then measurement may be performed.

In addition, the measurement extension is a process to increase the amount of charge of the detection capacitor C1 by adding a charging time if necessary when the measured value obtained after the elapse of the original charging time is very small. Generally, when the measured value is very small (for example, 100 mV or less), the insulation resistance is just regarded as large.

However, since depending on the system, the measured value may sometimes become 0 V even if there is an insulation failure due to specific conditions, it sometimes needs to distinguish whether the minute measurement value is due to the large insulation resistance or the specific condition of the system. In such a case, increase of the charge amount of the detection capacitor C1 by the measurement extension allows the situation to be grasped more accurately.

Therefore, the present invention aims at pausing charging while holding the charge in a ground fault detection device in which a flying capacitor is used and the measurement path is switched by a C-contact switch.

In order to solve the above problems, the ground fault detection device of the present invention, which is connected to an ungrounded battery, estimates an insulation resistance of a system provided with a battery, and detects a ground fault, includes: a capacitor that operates as a flying capacitor; two C-contact switches that switch a V0 charging path including the battery and the capacitor, a Vcn charging path including the battery, a negative-side insulation resistance that is an insulation resistance between a negative side of the battery and ground, and the capacitor, a Vcp charging path including the battery, a positive-side insulation resistance that is an insulation resistance between a positive-side insulation resistance of the battery and ground, and the capacitor, and a measurement path that serves both a charge voltage measurement and a discharge of the first capacitor; and an optical MOS-FET capable of blocking charge inflow to and charge outflow from the capacitor.

Here, the capacitor and the optical MOS-FET may be connected in series between common contacts of the two C-contact switches.

Also, a control unit for controlling the two C-contact switches and the optical MOS-FET is further provided. The control unit may switch the Vcn charging path or the Vcp charging path to the measurement path, and turn off the optical MOS-FET, and if a value of the charge voltage measurement acquired is less than or equal to a predetermined reference value, switch path back to the Vcn charging path or the Vcp charging path and turns on the optical MOS-FET.

Then, if the value of the charge voltage measurement acquired is more than the predetermined reference value, the control unit may turn on the optical MOS-FET so as to discharge the capacitor.

Further, the ground fault detection device may include a control unit for controlling the two C-contact switches and the optical MOS-FET, and when switching either or both of the two C-contact switches, turn off the optical MOS-FET immediately before switching, and turn back on the MOS-FET after switching is completed.

According to the present invention, in a ground fault detection device using a flying capacitor and switching measurement path by a C-contact switch, charging can be paused while holding the charge.

DETAILED DESCRIPTION OF THE PREFERRED EMBODIMENTS

Figure 1:
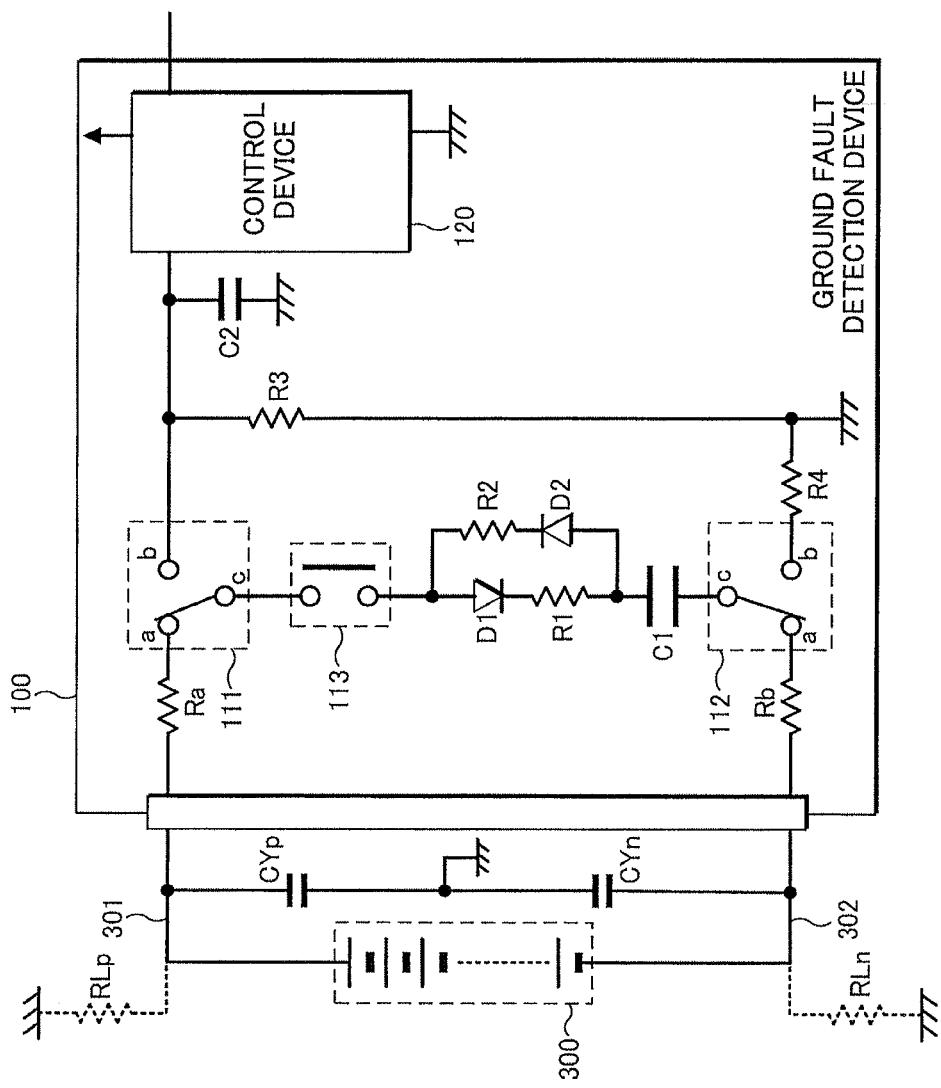
FIG. 1 is a block diagram showing a configuration of a ground fault detection device according to an embodiment of the present invention.

An embodiment of the present invention will be described in detail with reference to the drawings. FIG. 1 is a block diagram showing a structure of a ground fault detection device 100 which is related to an embodiment of the present invention. The ground fault detection device 100 as shown in this figure is a flying capacitor type device that detects a ground fault of the system connected to an ungrounded high voltage battery 300, and in which the high voltage battery 300 is provided. The ground fault detection device 100 is controlled by an external control device that is a host device (not shown).

Here, an insulation resistance between a positive electrode side of the high voltage battery 300 and the ground is expressed as RLp, and an insulation resistance between a negative electrode side and the ground as RLn. High voltage means higher one than a low voltage battery (typically 12V) for driving various devices in a vehicle (lamp, wiper), and the high voltage battery 300 is a battery used for driving the vehicle.

The high voltage battery 300 is constituted by a rechargeable battery such as a lithium ion battery, discharging via a high-voltage bus bar (not shown) and driving an electric motor connected via an inverter or the like. When regenerating or connecting to a charging facility, charging is performed via a high voltage bus bar.

Between a positive power line 301 and a ground electrode and between a negative power line 302 and the ground electrode of the high voltage battery 300, capacitors CYp and CYn called Y capacitors (line bypass capacitors) are connected in order to remove a high frequency noise of a power source or stabilize an operation. However, the Y capacitor may be omitted.

As shown in this figure, the ground fault detection device 100 is provided with a detection capacitor C1 that operates as a flying capacitor and a control device 120 composed of a microcomputer or the like. The control device 120, by executing a program incorporated in advance, executes various controls required for the ground fault detection device 100 such as switching processing to be mentioned later.

In the ground fault detection device 100, a positive electrode side C-contact switch 111 is used as a switching element of the positive power supply line 301 system, and a negative-side C-contact switch 112 is used as a switching element of the negative power line 302 system. The positive-side insulation resistance C-contact switch 111 and the negative-side C-contact switch 112 can be composed of, for example, a high voltage-small signal mechanical relay or a reed relay. In addition, in the ground fault detection device 100, one optical MOS-FET 113 is used in addition to the two C-contact switches 111.

Both the positive-side insulation resistance C-contact switch 111 and the negative-side C-contact switch 112 have a common contact c arranged on the detection capacitor C1 side. Specifically, the common contact c of the positive-side insulation resistance C-contact switch 111 is connected to the detection capacitor C1 via a parallel circuit of a path of a diode D1 and a resistance R1 and a path of a resistance R2 and a diode D2, the common contact c of the negative-side C-contact switch 112 is connected to the other end of the detection capacitor C1. The diode D1 serving as a charging path is connected in a direction which becomes forward from the positive-side insulation resistance C-contact switch 111 to the detection capacitor C1, and the diode D2 serving as a path during discharge is connected in the reverse direction. The resistance R2 serves as a discharge resistance.

The optical MOS-FET 113 enables energization/interruption of the charging/discharging path at high speed, and in order to form a charge holding state of the detection capacitor C1, is connected in series between the common contact c of the positive-side insulation resistance C-contact switch 111 and the common contact c of the negative-side C-contact switch 112.

In the example of this figure, the optical MOS-FET 113 is connected between the common contact c of the positive-side insulation resistance C-contact switch 111 and a parallel circuit with the diode D1 and the diode D2. However, it may be connected between the parallel circuit with the diode D1 and the diode D2 and the detection capacitor C1, or the detection capacitor C1 and the common contact c of the C-contact switch 112.

A contact a of the positive-side insulation resistance C-contact switch 111 is connected to the positive-side insulation resistance power supply line 301 via a resistance Ra, and a contact a of the negative-side C-contact switch 112 is connected to the positive electrode side power line 3 via a resistance Rb. That is, any C-contact switch has the contact a on the high voltage battery 300 side (normally open).

A contact b of the positive-side insulation resistance C-contact switch 111 is connected to a resistance R3 whose other end is grounded. A capacitor C2 having one end grounded is connected to the resistance R3, and a voltage generated in the resistance R3 is measured by the control device 120. The other end of the contact b of the negative-side C-contact switch 112 is connected to a resistance R4 whose other end is grounded. That is, any C-contact switch has the contact b on the control device 120 side (ground side) (normally closed).

However, both C-contact switches may be normally closed on the high voltage battery 300 side, or one C-contact switch of the high voltage battery 300 side may be normally closed.

As shown in FIG. 1, the positive-side insulation resistance C-contact switch 111, the negative-side C-contact switch 112, and the optical MOS-FET 113 are independently switched and controlled by the control device 120. The control device 120, by independently switching and controlling the positive-side insulation resistance C-contact switch 111 and the negative-side C-contact switch 112, switches the measurement path, charges or discharges the detection capacitor C1, and measures charging voltage. Also, by turning off the optical MOS-FET 113, it shuts off the charging/discharging path.

Figure 2:
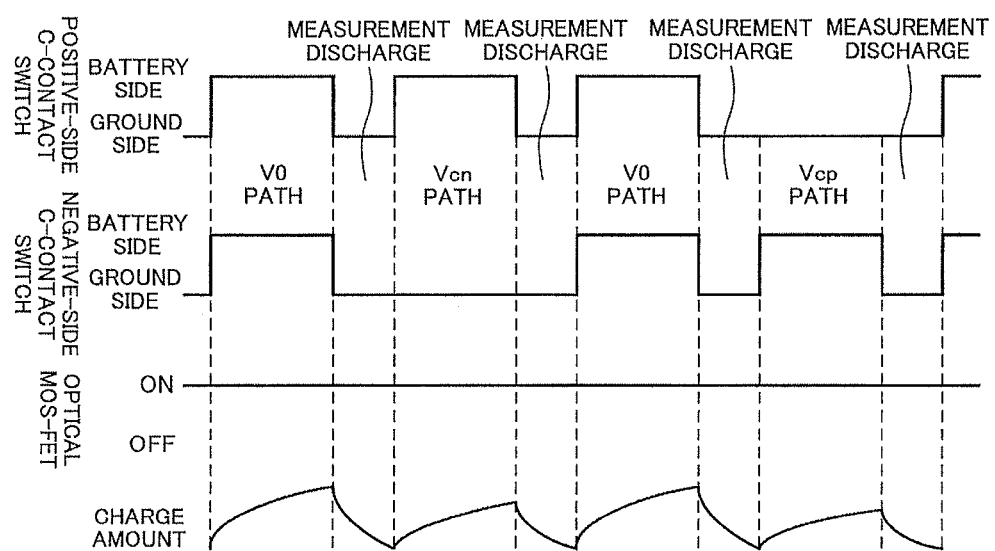
FIG. 2 is a timing chart of basic measurement operations.

Specifically, in a basic measurement operation in which V0 measurement period→Vcn measurement period→V0 measurement period→Vcp measurement period is set as one cycle, as shown in the timing chart of FIG. 2, the optical MOS-FET 113 is always turned on and the following switching is performed.

During the V0 measurement period, the positive-side insulation resistance C-contact switch 111 and the negative-side C-contact switch 112 are also switched to the contact a side (battery side), forming a measurement path of the high voltage battery 300, the resistance Ra, the resistance R1, a the detection capacitor C1 and the resistance Rb (V0 path in the figure).

When measuring the charging voltage of the detection capacitor C1, the positive-side insulation resistance C-contact switch 111 and the negative-side C-contact switch 112 are also switched to a contact b side (ground side) (measurement discharge in the figure). After that, the detection capacitor C1 is discharged through the same path. Operations when measuring the charging voltage of the detection capacitor C1, and when discharging are the same in other measurement periods.

In the Vcn measurement period, the positive-side insulation resistance C-contact switch 111 is switched to the contact a side (battery side) and the negative-side C-contact switch 112 is switched to the contact b side (ground side), forming a measurement path of the high voltage battery 300, the resistance Ra, the resistance R1, the detection capacitor C1, the resistance R4, the ground, and the insulation resistance RLn (Vcn path in the figure).

In the Vcp measurement period, the positive-side insulation resistance C-contact switch 111 is switched to the contact b side (ground side) and the negative-side C-contact switch 112 is switched to the contact a side (battery side), forming a measurement path of the high voltage battery 300, the insulation resistance RLp, the ground, the resistance R3, the resistance R1, the detection capacitor C1, and the resistance Rb (Vcp path in the figure).

On the other hand, when performing intermediate measurement and measurement extension functionally during the measurement period of Vcn and Vcp, the following operation can be performed for example. First, when performing intermediate measurement, this will be described with reference to the flowchart shown in FIG. 3 and the timing chart shown in FIG. 4.

Figure 3:
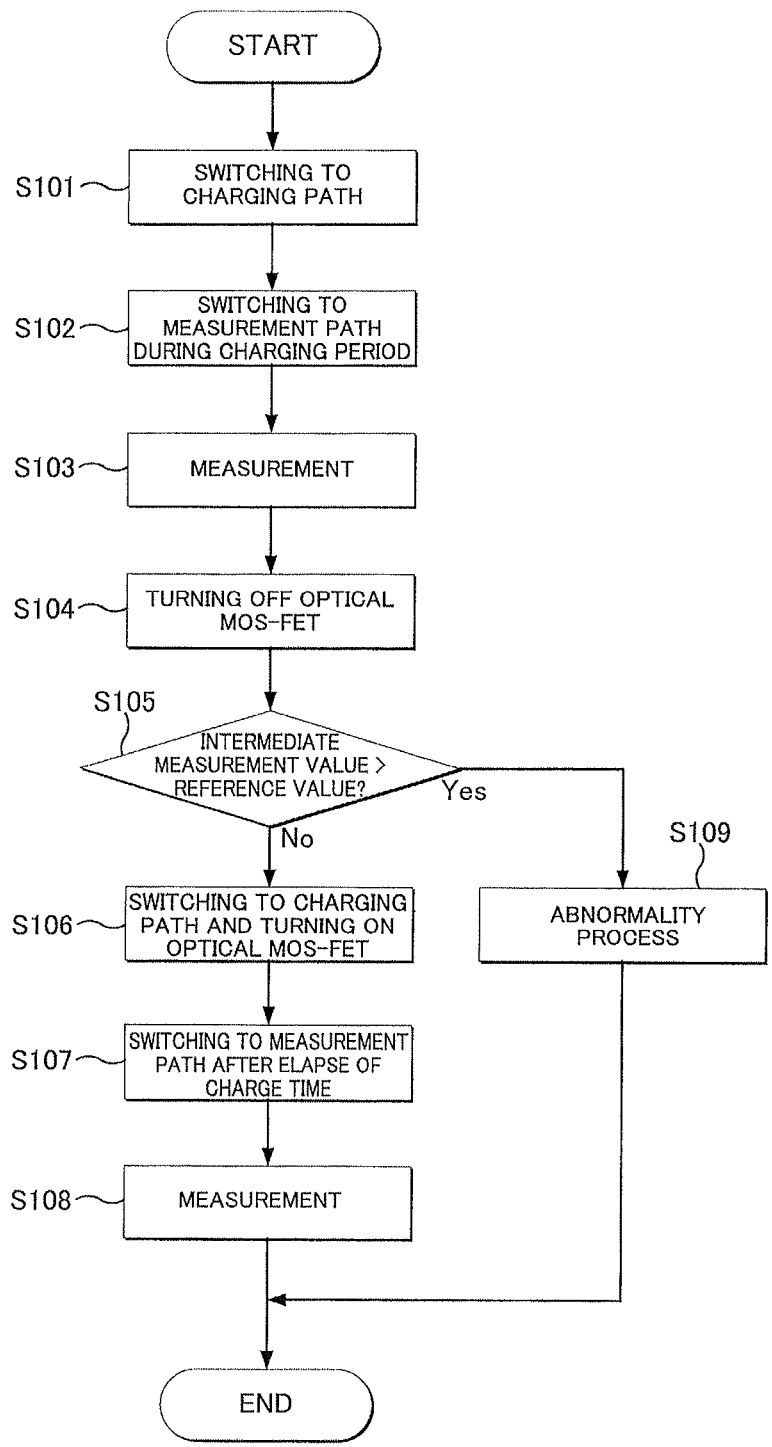
FIG. 3 is a flowchart for explaining intermediate measurement.

In order to measure Vcn or Vcp, the positive-side insulation resistance C-contact switch 111 and the negative-side C-contact switch 112 are switched to the charging path of the Vcn path or the Vcp path (FIG. 3: S101, FIG. 4: t1).

And during the charging time, the positive-side insulation resistance C-contact switch 111 and the negative-side C-contact switch 112 are switched to the measurement path and intermediate measurement is started (FIG. 3: S102, FIG. 4: t2). In order to hold the charge of the capacitor C1, the optical MOS-FET 113 is turned off after the start of the measurement (S104).

If the measurement value obtained in the intermediate measurement does not exceed the reference value (S105: No), assuming that abnormality does not occur, it is switched again to the charging path and the optical MOS-FET 113 is turned on (S106), and charging is resumed. And measure after a predetermined charging time, switching to the measurement path (S107), and Vcn or Vcp is measured (S108).

Figure 4:
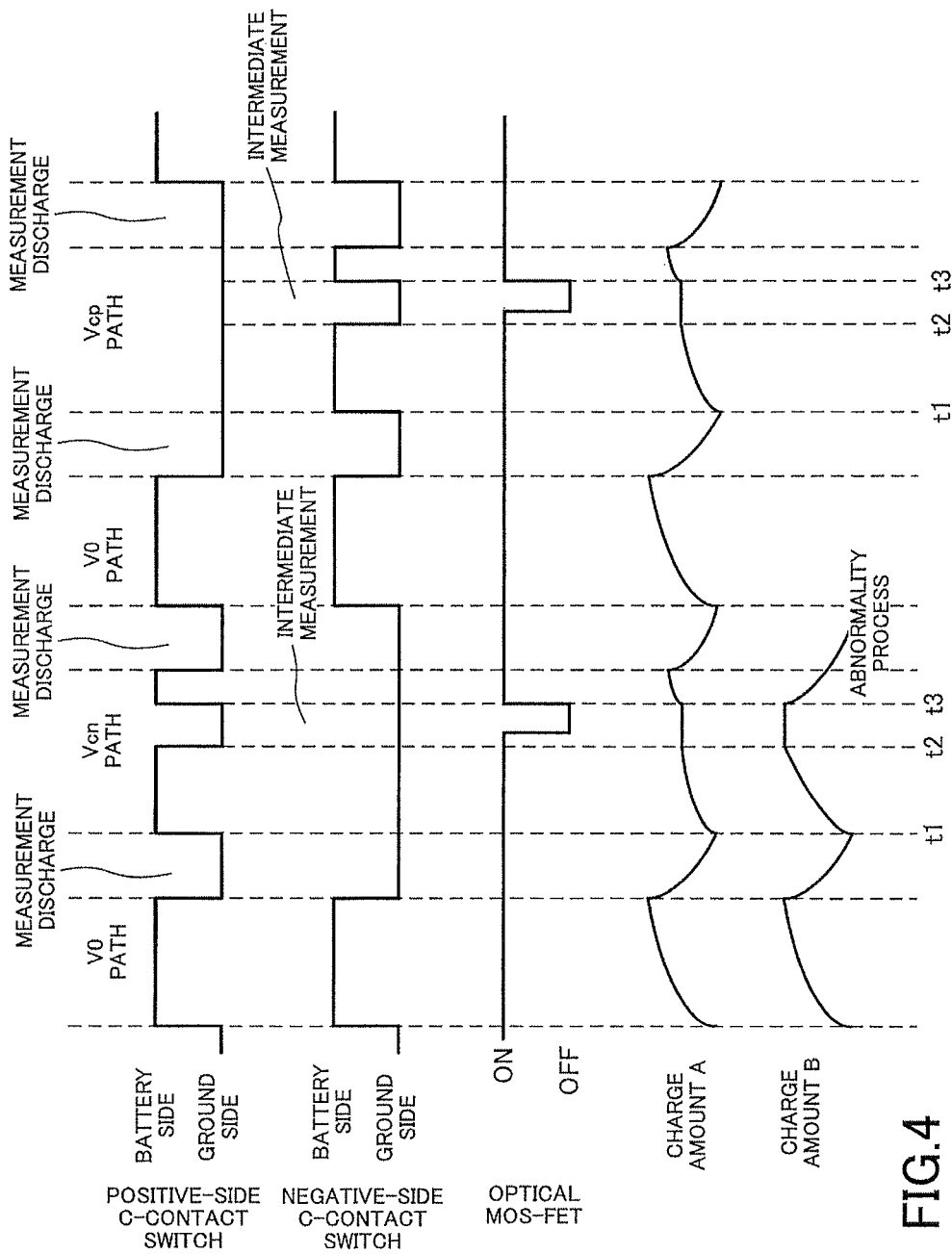
FIG. 4 is a timing chart for explaining intermediate measurement.

On the other hand, when the measurement value obtained in the intermediate measurement exceeds the reference value (S105: Yes), assuming that abnormality has occurred, abnormality processing is performed without resuming measurement (S109). The charge amount A in FIG. 4 represents an example of change in the charge amount when no abnormality has occurred, and the charge amount B an example of change in the charge amount when abnormality occurs in the Vcn path.

Next, the measurement extension will be described with reference to the flowchart shown in FIG. 5 and the timing chart shown in FIG. 6. In order to measure Vcn or Vcp, the positive-side insulation resistance C-contact switch 111 and the negative-side C-contact switch 112 are switched to the charging path of Vcn path or the Vcp path (FIG. 5: S201, FIG. 6: t1).

Figure 5:
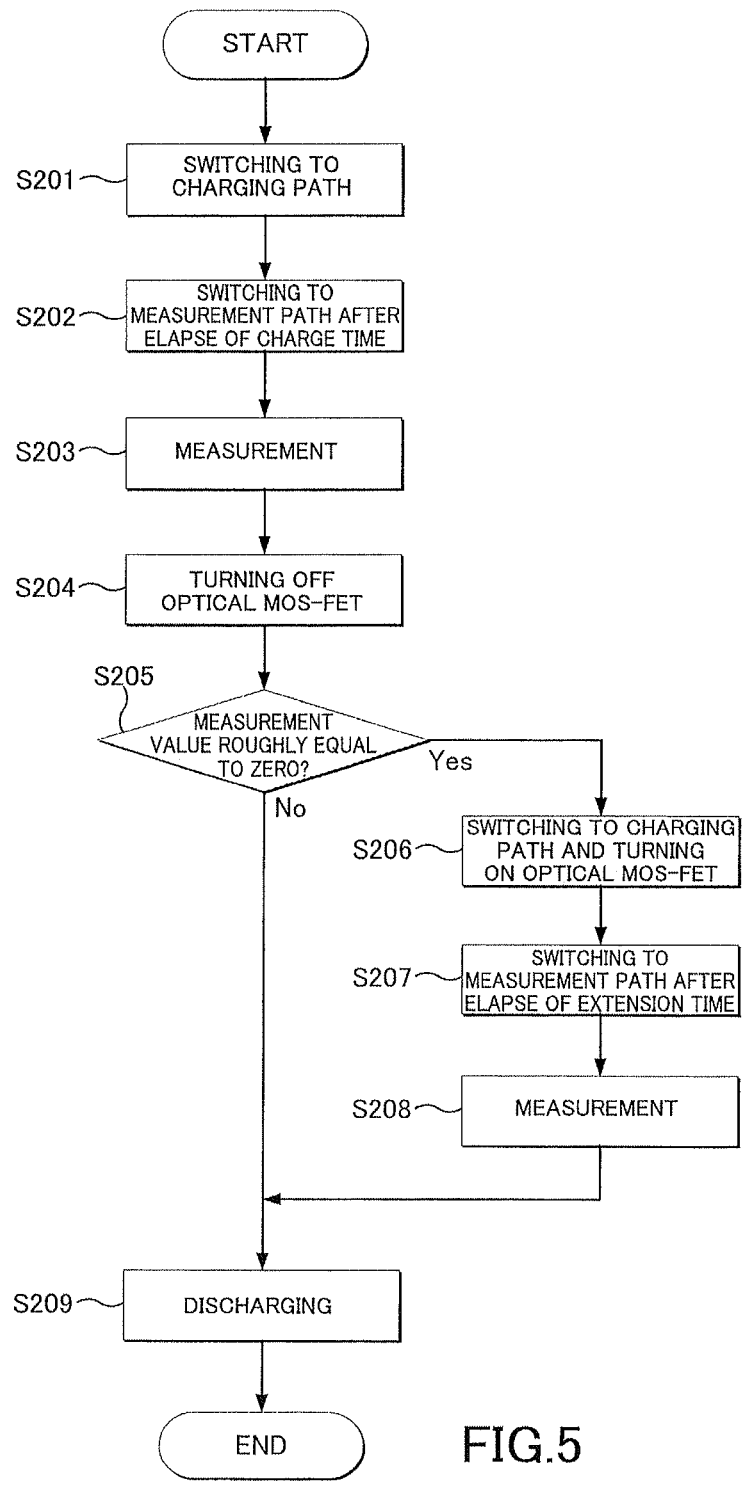
FIG. 5 is a flowchart explaining measurement extension.
Figure 6:
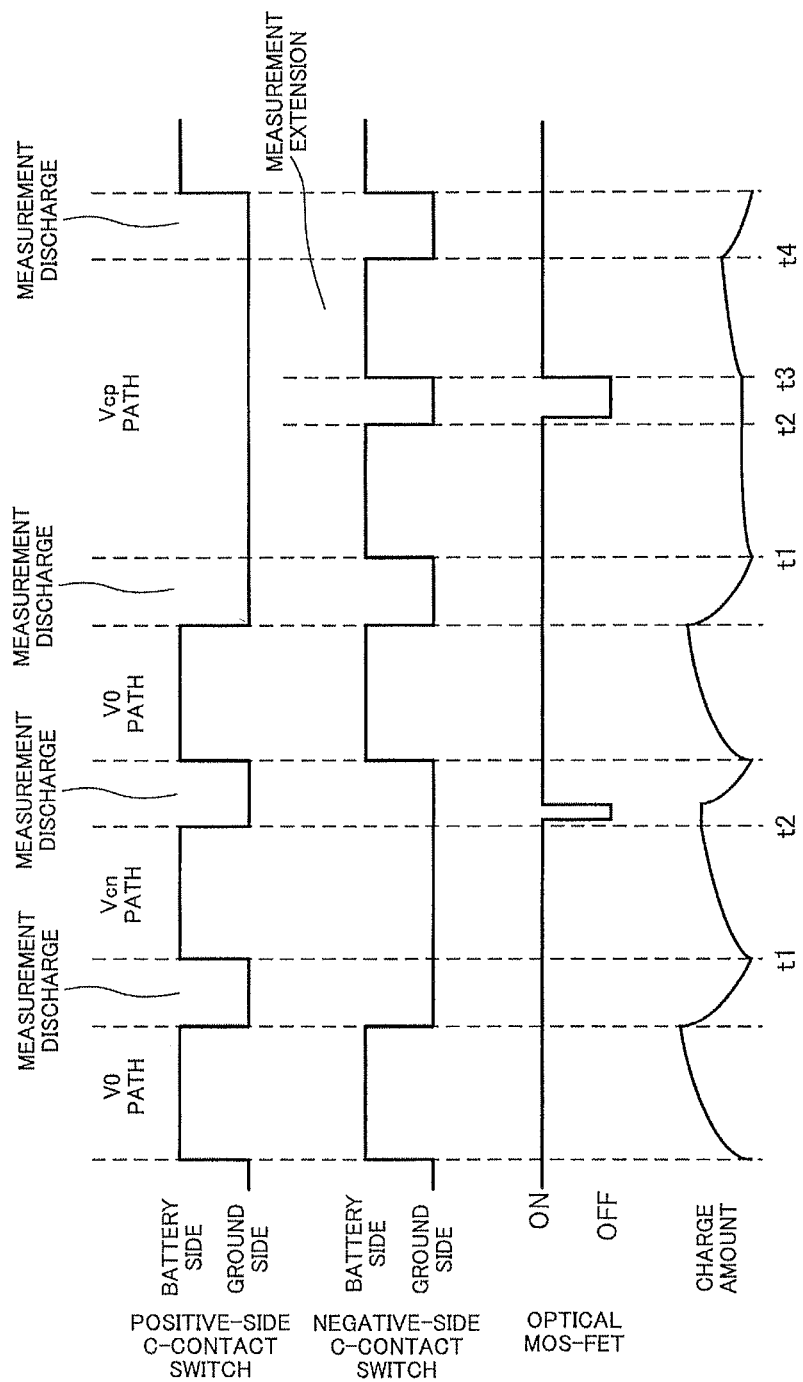
FIG. 6 is a timing chart explaining measurement extension.

Switching to the measurement path after elapse of a specified charging time (FIG. 5: S202, FIG. 6: t2), measurement of Vcn or Vcp is started (S203). In order to hold charge of the detection capacitor C1, the optical MOS-FET 113 is turned off in response to the start of measurement (204).

In order to determine whether or not the measurement extension is necessary, it is determined whether the measurement value is a minute value that can be regarded as 0 V (for example, 100 mV or less) (S205). If not (S205: No), the measurement extension is not performed, and the obtained value is set as the measurement value for Vcn or Vcp. And the optical MOS-FET is turned onto discharge the detection capacitor C1 (S209). The Vcn path in FIG. 6 shows an example when the measurement extension is not required, and the Vcp path shows an example when the measurement extension is performed.

On the other hand, if the measured value is the minute value (S205: Yes), the switches are set to the charging path for performing the measurement extension, and the optical MOS-FET is turned on (FIG. 5: S206, FIG. 6: t3). As a result, the charging is resumed in a state where the charge of the detection capacitor is maintained.

Then, after a predetermined extension time has elapsed, the switches are set to the measurement path (FIG. 5: S207, FIG. 6: t4), and more accurate situation is grasped by measuring (S208). The detection capacitor C1 is discharged after measurement (FIG. 5: S209, FIG. 6: t4).

By the way, because the C-contact switch is a mechanical contact configuration, there is a limit to the number of opening and closing durability. In particular, the greater energizing current and applied voltage at the time of switching, the greater the effect on switching durability. Therefore, in order to improve the number of opening and closing durability, the optical MOS-FET 113 may be used.

Figure 7:
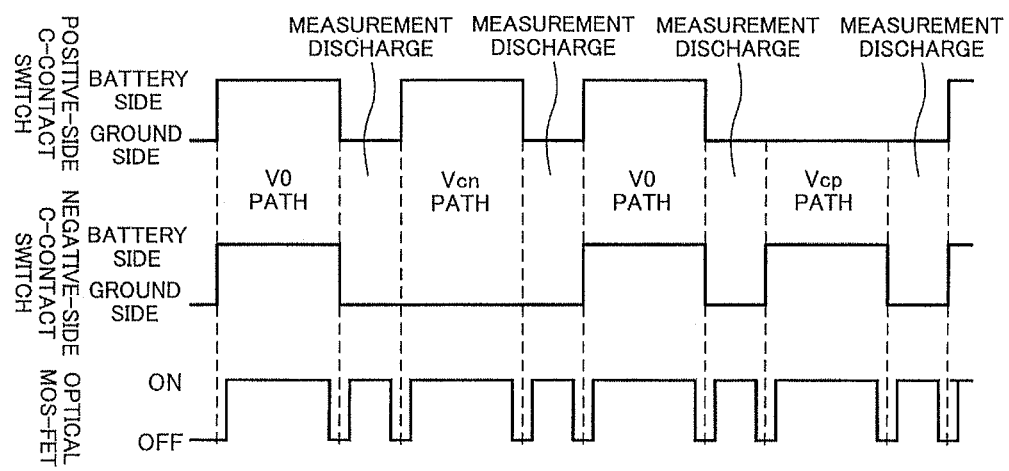
FIG. 7 is a timing chart explaining a control to improve the number of times of opening and closing the C-contact switch.
Figure 8:
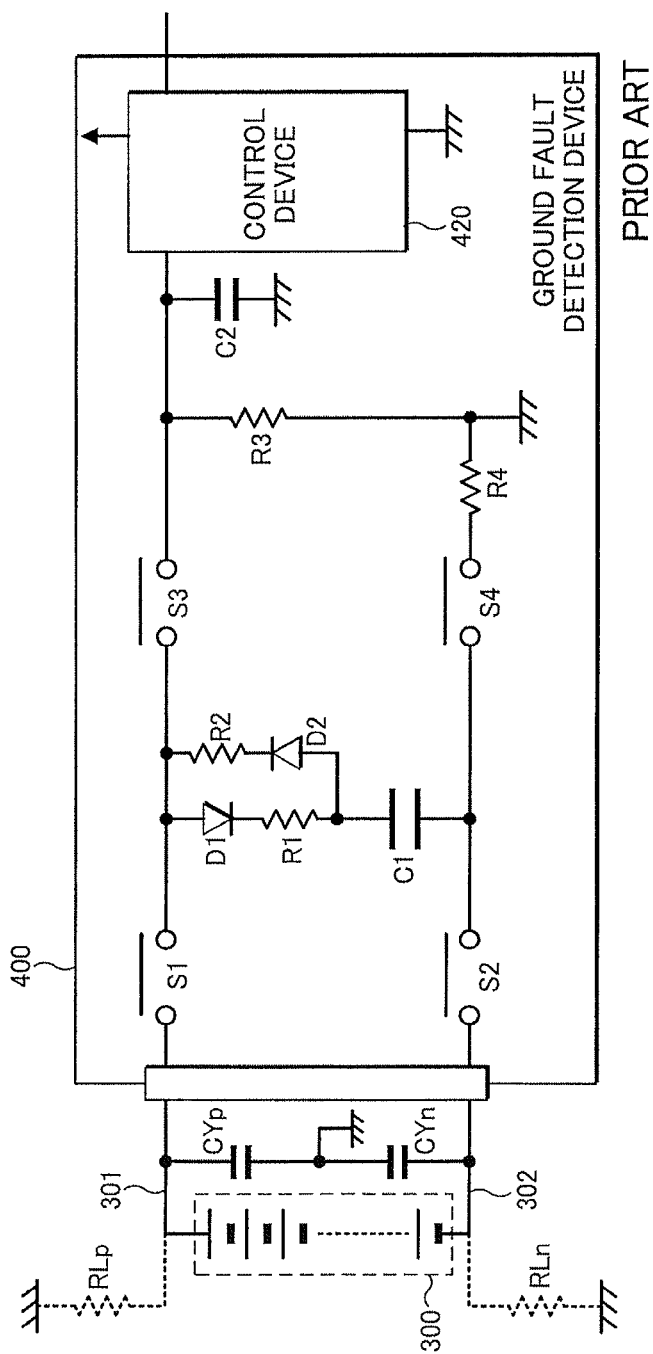
FIG. 8 is a diagram showing a circuit example of a conventional ground fault detection device of a flying capacitor method.
Figure 9A:
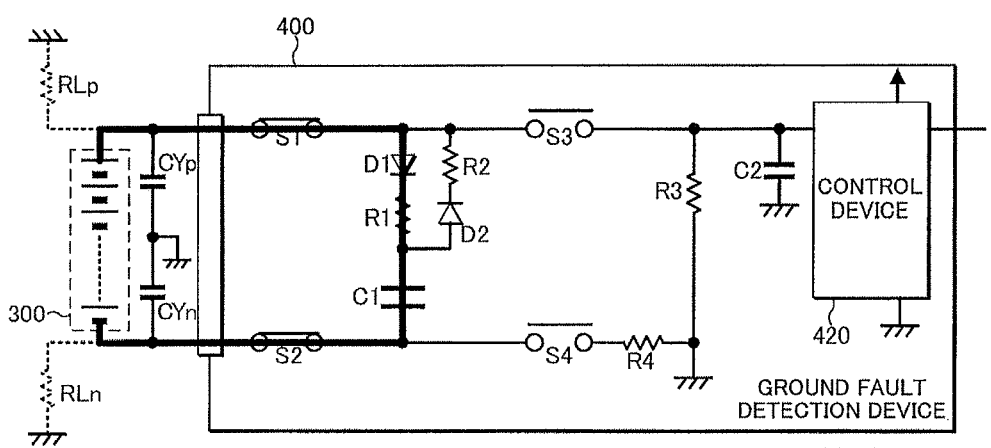
FIGS. 9A and 9B are diagrams showing a measurement path in a V0 measurement period.
Figure 9B:
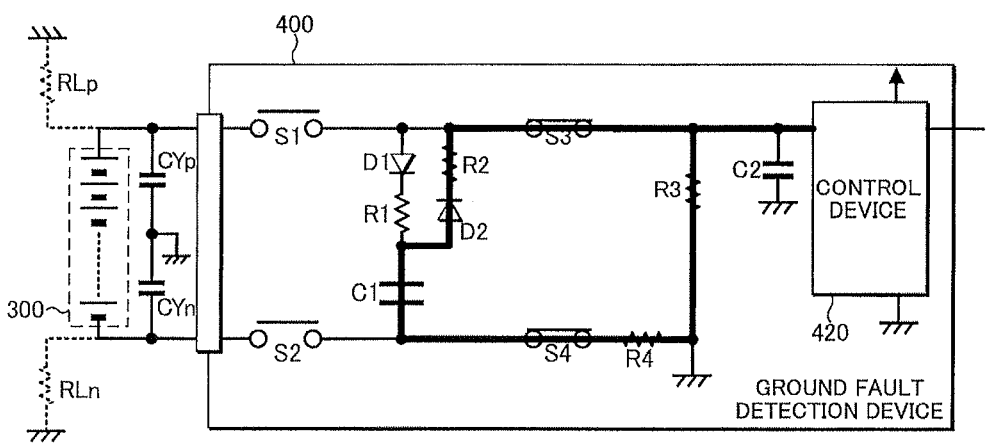
Figure 10A:
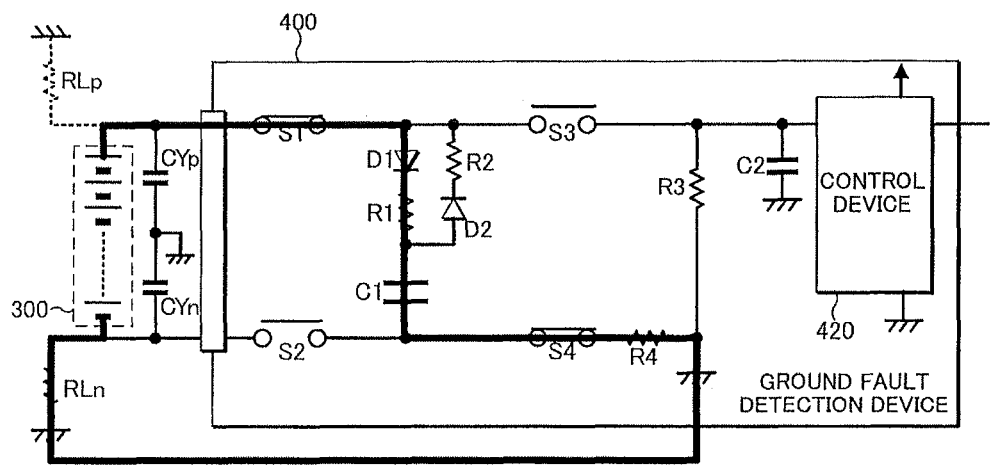
FIGS. 10A and 10B are diagrams showing a measurement path of a Vcn measurement period and a Vcp measurement period.
Figure 10B:
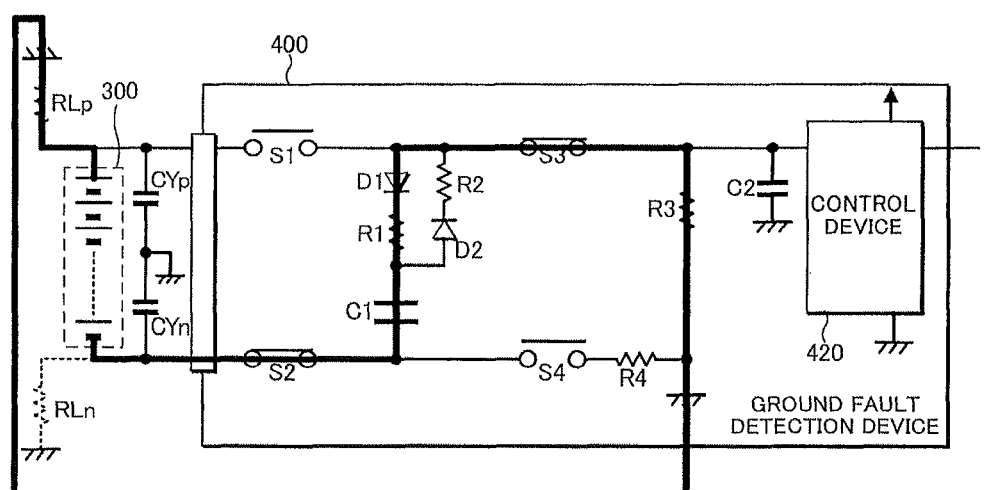
Figure 11:
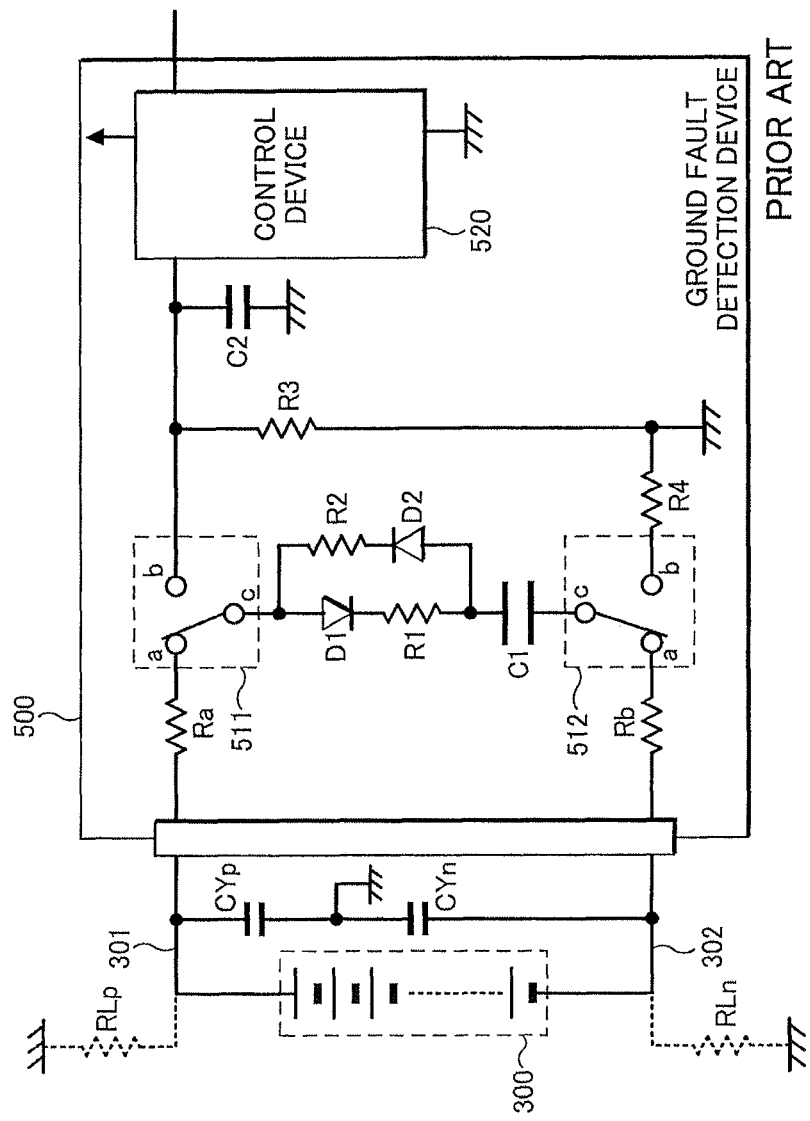
FIG. 11 is a diagram showing an example of a flying capacitor type ground fault detection device circuit using C-contact switch.

In this case, as shown in the timing chart of FIG. 7, when switching any one or both of the C-contact switches, the MOS-FET 113 is turned off just before switching the C-contact switch, and is turned on after the C-contact switch is completely switched.

This allows a non-energized state when the C-contact switch is switched, suppressing electrical deterioration and improving the number of opening and closing durability. In addition, reducing the amount of discharge of charge due to reaction rate of the C-contact switch improves measurement accuracy.

Also, in the ground fault detection device 100 of this embodiment, since equipped with the optical MOS-FET 113 that can cut off the charging and discharging path, has effect of improving safety in case of emergency such as failure of C-contact switch.

Also, since the charge of the detection capacitor C1 can be temporarily stored, the detection capacitor C has a refresh function or the like when an electric field capacitor is employed for the detection capacitor C1.

REFERENCE SIGNS LIST

100 ground fault detection device
111 positive-side insulation resistance C-contact switch
112 negative-side C-contact switch
113 optical MOS-FET
120 control device
300 high voltage battery
301 positive power line
302 negative power line

What is claimed is:

1. A ground fault detection device connected to an ungrounded battery for estimating an insulation resistance of a system where a battery is installed so as to detect a ground fault, comprising:

a capacitor that operates as a flying capacitor;
two C-contact switches that switch a first charging path including the battery and the capacitor, a second charging path including the battery, a negative-side insulation resistance that is an insulation resistance between a negative side of the battery and ground, and the capacitor, a third charging path including the battery, a positive-side insulation resistance that is an insulation resistance between a positive side of the battery and ground, and the capacitor, and a measurement path that serves both a charge voltage measurement and a discharge of the first capacitor;

an optical MOS-FET capable of blocking charge inflow to and charge outflow from the capacitor; and a control unit for controlling the two C-contact switches and the optical MOS-FET, wherein the control unit switches the second charging path or the second charging path to the measurement path, and turns off the optical MOS-FET.

2. The ground fault detection device according to claim 1, wherein the capacitor and the optical MOS-FET are connected in series between common contacts of the two C-contact switches.

3. The ground fault detection device according to claim 1, wherein the control unit, if a value of the charge voltage measurement acquired is less than or equal to a predetermined reference value, switches path back to the second charging path or the third charging path and turns on the optical MOS-FET.

4. The ground fault detection device according to claim 2, wherein the control unit, if a value of the charge voltage measurement acquired is less than or equal to a predetermined reference value, switches path back to the second charging path or the third charging path and turns on the optical MOS-FET.

5. The ground fault detection device according to claim 3, wherein the control unit, if the value of the charge voltage measurement acquired is more than the predetermined reference value, turns on the optical MOS-FET so as to discharge the capacitor.

6. The ground fault detection device according to claim 4, wherein the control unit, if the value of the charge voltage measurement acquired is more than the predetermined reference value, turns on the optical MOS-FET so as to discharge the capacitor.

7. The ground fault detection device according to claim 1, further comprising a control unit for controlling the two C-contact switches and the optical MOS-FET, wherein the control unit, when switching either or both of the two C-contact switches, turns off the optical MOS-FET immediately before switching, and turns back on the optical MOS-FET after switching is completed.

8. The ground fault detection device according to claim 2, further comprising a control unit for controlling the two C-contact switches and the optical MOS-FET, wherein the control unit, when switching either or both of the two C-contact switches, turns off the optical MOS-FET immediately before switching, and turns back on the optical MOS-FET after switching is completed.

9. A ground fault detection device connected to an ungrounded battery for estimating an insulation resistance of a system where a battery is installed so as to detect a ground fault, comprising:

a capacitor that operates as a flying capacitor;

two C-contact switches that switch a first charging path including the battery and the capacitor, a second charging path including the battery, a negative-side insulation resistance that is an insulation resistance between a negative side of the battery and ground, and the capacitor, a third charging path including the battery, a positive-side insulation resistance that is an insulation resistance between a positive side of the battery and ground, and the capacitor, and a measurement path that serves both a charge voltage measurement and a discharge of the first capacitor;

an optical MOS-FET capable of blocking charge inflow to and charge outflow from the capacitor; and a control unit for controlling the two C-contact switches and the optical MOS-FET, wherein the control unit, when switching either or both of the two C-contact switches, turns off the optical MOS-FET immediately before switching, and turns back on the optical MOS-FET after switching is completed.

\* \* \* \* \*